United States Patent
Lee et al.

(10) Patent No.: US 10,818,865 B2
(45) Date of Patent: Oct. 27, 2020

(54) MULTIPLE HOLE INJECTION STRUCTURE ON OXIDIZED ALUMINUM AND APPLICATIONS THEREOF IN ORGANIC LUMINESCENT DEVICES

(71) Applicant: LAKESIDE PHOTOELECTRONIC TECHNOLOGY (JIANGSU) CO., Jin Tan, Changzhou (CN)

(72) Inventors: Jae Jin Lee, Toronto (CA); Zheng-Hong Lu, Toronto (CA)

(73) Assignee: LAKESIDE PHOTOELECTRONIC TECHNOLOGY (JIANGSU) CO., LTD., Jin Tan, Changzhou (CN)

( * ) Notice: Subject to any disclaimer, the term of this patent is extended or adjusted under 35 U.S.C. 154(b) by 0 days.

(21) Appl. No.: 16/420,659

(22) Filed: May 23, 2019

(65) Prior Publication Data
US 2020/0127221 A1    Apr. 23, 2020

Related U.S. Application Data

(60) Provisional application No. 62/746,905, filed on Oct. 17, 2018.

(51) Int. Cl.
  *H01L 51/50*    (2006.01)
  *H01L 51/52*    (2006.01)
(52) U.S. Cl.
  CPC ...... *H01L 51/5088* (2013.01); *H01L 51/5218* (2013.01); *H01L 2251/303* (2013.01); *H01L 2251/558* (2013.01)

(58) Field of Classification Search
  CPC .................. H01L 51/5088; H01L 51/5218
  See application file for complete search history.

(56) References Cited

U.S. PATENT DOCUMENTS

| | | | |
|---|---|---|---|
| 2004/0113547 A1* | 6/2004 | Son | H01L 51/5218 313/504 |
| 2009/0160325 A1* | 6/2009 | Yatsunami | C09K 11/06 313/504 |

(Continued)

OTHER PUBLICATIONS

U. Vogel, B. Richter, P. Wartenberg, P. König, O.R. Hild, K. Fehse, M. Schober, E. Bodenstein, and B. Beyer, in SPIE Digital Optical Technologies: Proceedings of SPIE vol. 10335, Munich, Germany, Jun. 25-Jun. 29, 2017, edited by B. C. Kress, W. Osten, and H.P. Urbach (Digital Optical Technologies, 2017), pp. 1033503-1.

(Continued)

*Primary Examiner* — Christine A Enad
(74) *Attorney, Agent, or Firm* — Hill & Schumacher

(57) ABSTRACT

The present disclosure provides multilayered hole injection structures including one or more layers of oxides for application in an organic electroluminescent device. The layered structures include an insulating metal oxide such as $Al_2O_3$ including a transition metal oxide to lower the hole injection barrier and enable hole transfer which is sandwiched between the conductive aluminum layer and a hole transport layer. The layered structure may also include a tri-layered structure stacked sequentially including a first electrically conductive layer, an insulating metal oxide and a hole injection layer material selected from a group of transition metal oxides.

17 Claims, 11 Drawing Sheets

(56) References Cited

U.S. PATENT DOCUMENTS

| | | | |
|---|---|---|---|
| 2009/0243478 A1* | 10/2009 | Shoda | H01L 51/5048 |
| | | | 313/504 |
| 2012/0205709 A1* | 8/2012 | Yamazaki | H01L 51/5088 |
| | | | 257/99 |
| 2014/0077202 A1 | 3/2014 | Zhoe et al. | |
| 2015/0008409 A1* | 1/2015 | Ito | C07F 7/21 |
| | | | 257/40 |
| 2016/0325113 A1* | 11/2016 | Khan | A61N 5/062 |
| 2018/0006067 A1* | 1/2018 | Ogawa | H01L 27/1446 |
| 2018/0375057 A1* | 12/2018 | Shin | H01L 51/0023 |
| 2019/0157344 A1* | 5/2019 | Wei | H01L 27/222 |

OTHER PUBLICATIONS

C.-W. Chen, P.-Y. Hsieh, H.-H. Chiang, C.-L. Lin, H.-M. Wu, Appl. Phys. Lett. 83, 5127 (2003).

J. Lee, R.B. Pode, D.G. Moon, J.I. Han, N.H. Park, S.H. Baik, and S.S. Ju, Phys. Status Solidi A. 201, 1022 (2004).

* cited by examiner

MULTIPLE HOLE INJECTION STRUCTURE ON OXIDIZED ALUMINUM AND APPLICATIONS THEREOF IN ORGANIC LUMINESCENT DEVICES

FIELD

This disclosure relates to the field of producing a multi-layered hole injection structure on an oxidized anode of aluminum or aluminum-based compound films. The oxidized aluminum is formed naturally in ambient environment, or by deposition techniques or by ozone gas oxidation. The present disclosure also relates to a multilayered hole injection structure comprised of aluminum or aluminum-based compounds, the native insulating oxide layer on top of the aluminum, and one or more transition metal oxide on top of the native insulating oxide layer. This disclosure is also in the field of application of the method of producing the multilayered hole injection structure on the oxidized metal anode to be used to inject holes for organic luminescent devices such as organic light-emitting diodes (OLED), perovskite light-emitting diodes, polymer light-emitting diodes, and others.

BACKGROUND

The anode configuration of organic light-emitting diode-on-silicon (OLEDoS) plays a critical role in achieving high luminance and current efficiency for microdisplay applications. Attributing to the incoming popularity of organic emissive display technologies and interest in near-eye applications, current processes utilize a highly-reflective metal anode to optically isolate the thin film transistors and the organic light-emitting diode (OLED). Previously, researchers and industry have assumed that metal surfaces which form insulating oxides are detrimental to device performance as it significantly hinders hole injecting properties. For example, in the current fabrication process of an OLEDoS device with exposure to moisture and oxygen, the luminance parameters can decrease up to 70% due to limitations on device configuration (U. Vogel, B. Richter, P. Wartenberg, P. König, O. R. Hild, K. Fehse, M. Schober, E. Bodenstein, and B. Beyer, in *SPIE Digital Optical Technologies: Proceedings of SPIE* Volume 10335, Munich, Germany, 25 Jun.-29 Jun. 2017, edited by B. C. Kress, W. Osten, and H. P. Urbach (Digital Optical Technologies, 2017), pp. 1033503-1).

The silicon wafer is externally supplied and post-processed by patterning of the anode layers on top. The device is then transferred to an OLED fabrication facility, but before the OLED layers can be deposited, the native insulating oxide layer forms on the metal or metal-based compound anode during and after the patterning process. This former process significantly hinders hole injecting properties of the anode structure leading to luminance and efficiency degradation. Current solutions to this complication include, but are not limited to using Ag, Au, Ni, or other highly reflective metals (over 80% reflectivity across parts of ultra-violet, visible, and near-infrared light spectrums) whose surfaces are less reactive with oxygen (M. Zhou, P. Wang, X. Feng, H. Huang, U.S. patent application US20140077202A1 (20 Mar. 2014); C.-W. Chen, P.-Y. Hsieh, H.-H. Chiang, C.-L. Lin, H.-M. Wu, Appl. Phys. Lett. 83, 5127 (2003); C. J. Lee, R. B. Pode, D. G. Moon, J. I. Han, N. H. Park, S. H. Baik, and S. S. Ju, Phys. Status Solidi A. 201, 1022 (2004)). Silver is used in the academic community as a suitable anode alternative due to its high conductivity and transmittance. Other methods include removal or reduction of the native insulating oxide layer and expensive in situ fabrication processes. For example, LG Chem Ltd. disclosed a patent to reduce the native oxide layer by adding in a metal with a higher oxidation rate on the cathode (J.-H. Lee, J.-B. Kim, Y.-H. Hahm, WO 2007/089117 published Aug. 9, 2007). However, a paradigm solution for the hole injection structure is yet to be disclosed for an anode structure. Thus, an alternative configuration of materials for anodes is desired.

Conventional methods of removing or reducing native insulating oxides by expensive in situ procedures can be replaced by simpler fabrication processes. By enabling a multiple hole injection structure comprised of a stacked oxide heterojunction, the combination of diffusion through the aluminum or aluminum-based compound pinholes and the reduction reaction of the transition metal oxide lowers the hole injection barrier, thereby leading to highly efficient organic luminescent devices.

Furthermore, aluminum is one of the most abundant elements in the Earth's crust and is widely used in many industrial and consumer applications. Compared to other metal anodes, aluminum films have excellent morphology and high reflectivity across all parts of the visible, near-infrared, and UV spectrums. The structures disclosure herein also use the multiple hole injection structure of oxide-oxide heterojunctions to open up more industrial opportunities for oxidized aluminum anode to be utilized in future generation of organic luminescent devices.

The prior art shows no examples of production of a multiple hole injection structure comprised of a transition metal oxide on top of an insulating metal oxide which is grown on top of the aluminum film. The transition metal oxide is deposited on top of oxidized aluminum or aluminum-based compounds by deposition techniques including, but not limited to plasma-enhanced chemical vapor deposition (PECVD), atomic layer deposition (ALD), physical vapor deposition (PVD), chemical vapor deposition (CVD), wherein the oxidized aluminum or oxidized aluminum-based compounds is grown in ambient environment, or by deposition techniques including, but not limited to PECVD, ALD, PVD, CVD, or a low temperature process through ozone gas oxidation, wherein the ozone gas is produced by, but not limited to, UV irradiation of oxygen in ambient environment.

The prior art shows no examples of the use of a multiple hole injection anode structure comprised of one or more transition metal oxide on top of the insulating metal oxide, a layer of insulating metal oxide on top of the aluminum or aluminum-based compounds, and aluminum or aluminum-based compound films of the same insulating metal oxide for OLEDs.

The above identified references, applications and patents, including appendices and references, are hereby incorporated by reference.

SUMMARY

In the present disclosure, the discovery of an oxide-oxide heterojunction anode structure results in multiple interfaces allowing efficient hole injection and transfer.

The present disclosure incorporates a multi-layered film structure including an oxide heterojunction to provide efficient hole injection into a hole transport layer. Moreover, in this disclosure, the multiple hole injection structure may be applied in an organic luminescent device to achieve high luminance properties. The purpose of these multi-layered hole injection film structures is to provide controlled hole injection into the hole transport layer by diffusion through aluminum or aluminum-based compound pinholes enabling high electrical conductivity.

Thus, the present disclosure provides a multiple hole injection structure comprising a substrate, a hole injection structure including an electrically conductive layer defining an anode on the substrate such as aluminum or aluminum-based compounds, a native insulating oxide of the same aluminum or aluminum-based compounds, and another hole injection layer comprising of one or more transition metal oxide.

In further embodiment there is provided a light-emitting device, comprising a substrate, a hole injection structure including an electrically conductive layer defining an anode on the substrate such as aluminum or aluminum-based compounds, a native insulating oxide of the same aluminum of aluminum-based compounds, another hole injection layer comprising of a transition metal oxide. On top of the transition metal oxide, the device includes a layer comprising of a hole transport layer, an electroluminescent layer on the hole transport layer, an electron transport layer on the electroluminescent layer, an electron injection layer on the electron transport layer, an electrically conductive layer defining a cathode layer on the electron injection layer, and an encapsulating layer, where all of them may be comprised of organic and inorganic molecules.

The employment of a multiple hole injection structure utilizing the native aluminum oxide and transition metal oxide as the anode in electronic devices leads to significantly improved device operating characteristics.

Thus the present disclosure provides a light-emitting device, comprising:
a) a substrate;
b) an aluminum metal layer on said substrate said aluminum metal layer having a surface oxide layer with a thickness in a range from about 0.5 to about 4 nanometers;
c) a multiple layered hole injection structure comprising
a layer of a high work function reduced transition metal oxide material on top of said surface oxide layer;
a hole transport layer on top of said high work function reduced transition metal oxide material, wherein the high work function reduced transition metal oxide material creates an electrically conductive contact with the underlying aluminum metal layer to allow hole transfer from the aluminum metal layer to the hole transport layer through said surface oxide layer;
d) a layer of an electroluminescent material on the multiple layered hole injection structure;
e) an electrically conductive and optically transparent cathode layer on the electroluminescent material; and
f) an electrical power supply to connect the anode and cathode.

The light-emitting device may further comprise an electron transport layer on top of the layer of an electroluminescent material sandwiched between the electroluminescent material and said an electrically conductive and optically transparent cathode layer.

The surface oxide layer on top of the aluminum layer may be formed by exposing the aluminum layer to ambient environment.

The surface oxide layer on top of the aluminum layer may be formed by exposing the aluminum layer to UV-ozone environment.

The surface oxide layer on top of the aluminum layer may be formed by exposing the aluminum layer to an oxygen containing plasma.

The surface oxide layer on top of the aluminum layer may be formed using chemical vapor deposition.

The surface oxide layer on top of the aluminum layer may contain nitrogen.

The surface oxide layer on top of the aluminum layer may have a thickness in a range from about 0.5 nm to about 4 nm.

The layer of high work function transition metal oxide material may have a work function larger than about 5 eV.

The layer of high work function material may be a metal oxide layer. The metal oxide layer may be a layer of any one of $MoO_3$, $ReO_3$, and $WO_3$.

The layer of a high work function material may be a nitrogen containing compound with a work function greater than 5.2 eV. This nitrogen containing compound may be, but is not limited to, TiN, poly(3, 4-ethylenedioxthiophene) polystyrene sulfonate (PEDOT:PSS), or poly(9-vinylcarbazole) (PVK).

The aluminum may be selected from the group consisting of aluminum or aluminum-based compounds. The aluminum may be selected from the group consisting of aluminum or aluminum-based compounds including but not limited to Al, AgAl, TiAl, or CuAl based alloys.

The light-emitting devices disclosed herein will now be described with reference to the following examples by referring to the accompanying Figures.

BRIEF DESCRIPTION OF THE DRAWINGS

The multilayered hole injection structure and the light-emitting device produced according to the present disclosure will now be described, by way of example only, reference being made to the accompanying drawings, in which.

Figure 1:
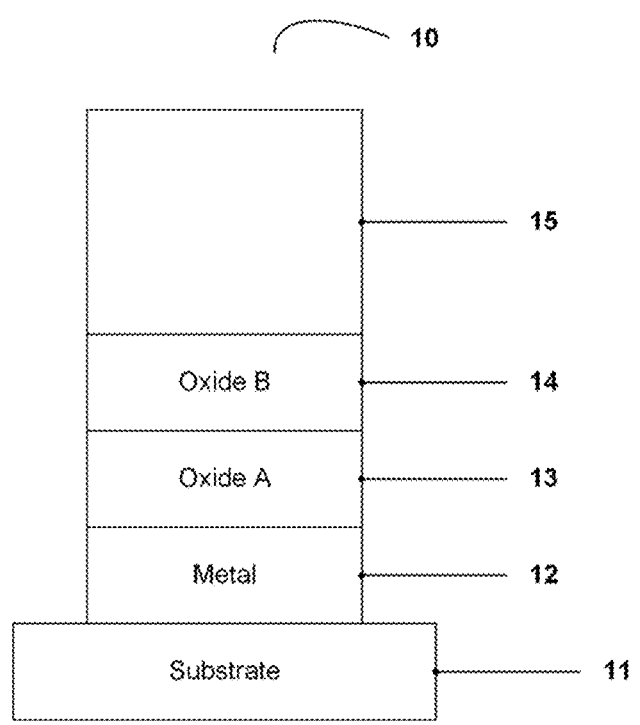
FIG. 1 is a sectional view of the multiple hole injection produced in accordance with the present disclosure.

(2-pyrindinyl-N)phenyl-C][acetylacetonato)iridium(III) or Ir(ppy)$_2$(acac) (dopant) as the emissive layer (15 nm), 2,2', 2"-(1,3,5-Benzinetriyl)-tris(1-phenyl-1-H-benzimidazole) or TPBi (65 nm) as the electron transporting layer, lithium fluoride (LiF) as the electron injecting layer (1 nm), a co-deposition of magnesium and silver to form an alloy electrode with a low work function (2 nm). Another silver layer is deposited on top of the alloy as the cathode (15 nm) and finally N,N'-di-[(1-naphthalenyl)-N,N'-diphenyl]-1,1'-biphenyl-4,4'-diamine (NPB) is used as the organic encapsulating layer (60 nm).

Figure 2:
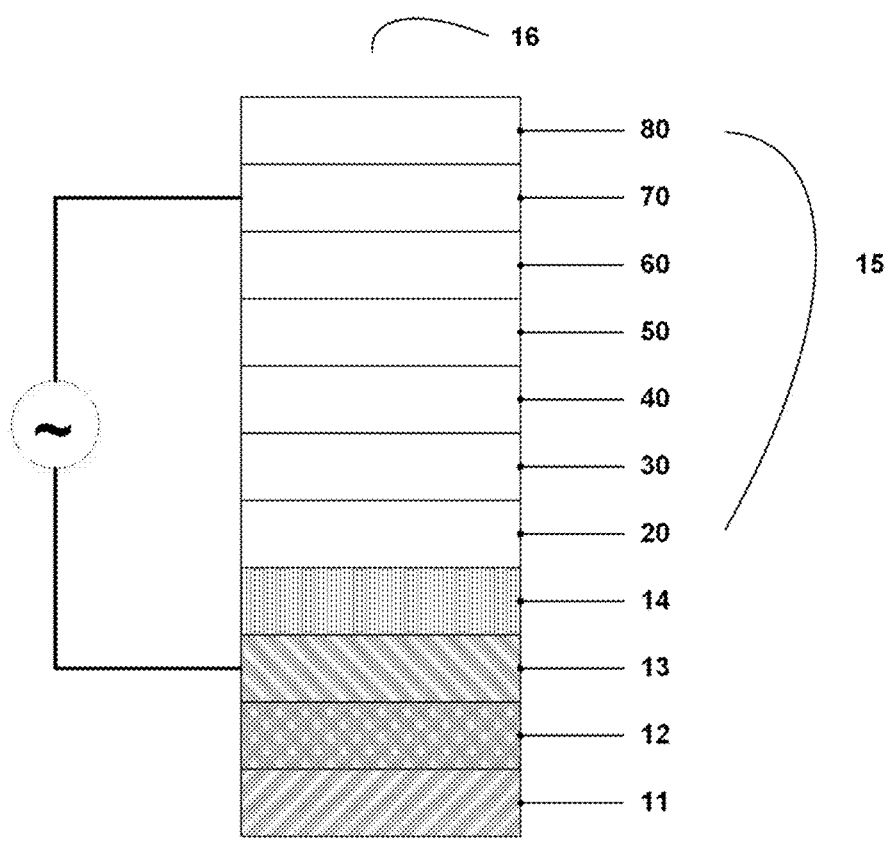
FIG. 2 is a schematic cross-sectional view of a light-emitting device comprised of the multiple hole injection structure produced in accordance with the present disclosure.
Figure 3:
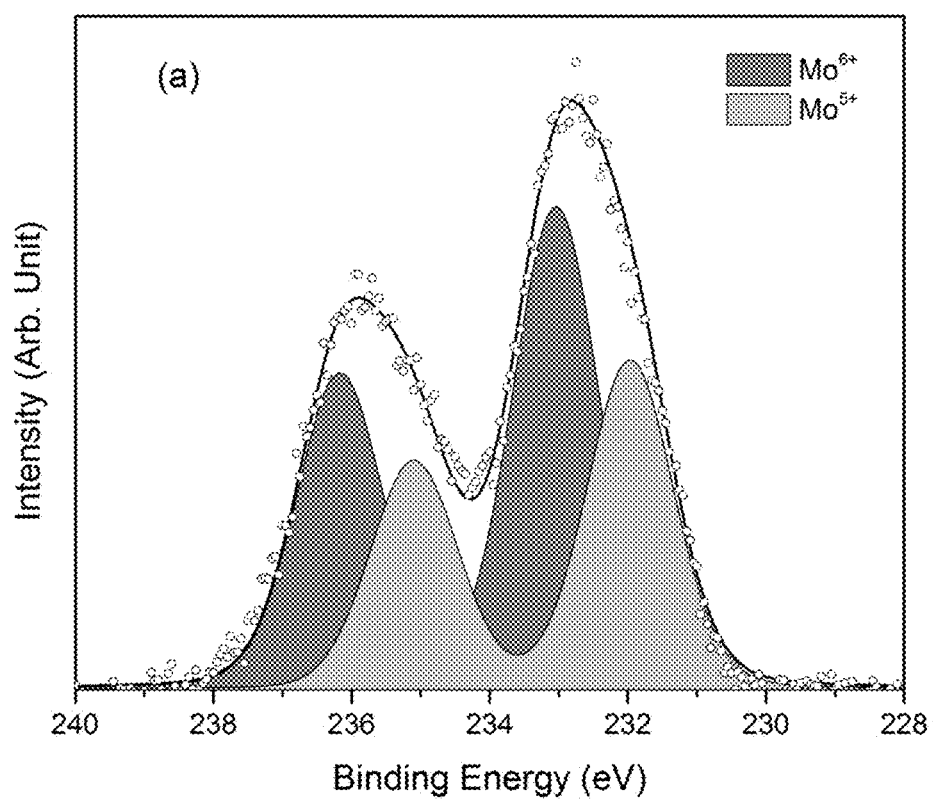
FIG. 3 shows the XPS spectra of the following structure: substrate/metal anode/insulating oxide of the same metal anode/transition metal oxide. The following stacking sequence was constructed to provide evidence of a molybdenum reduction reaction with the aluminum anode through the aluminum oxide: glass substrate/Al (150 nm)/$Al_2O_3$ (2.6 nm)/$MoO_3$ (1 nm). This figure helps identify a higher ratio of $Mo^{5+}$ compared to $Mo^{6+}$ implying there is a reduction reaction, thereby allowing efficient hole transfer through the multiple hole injection structure.
Figure 4:
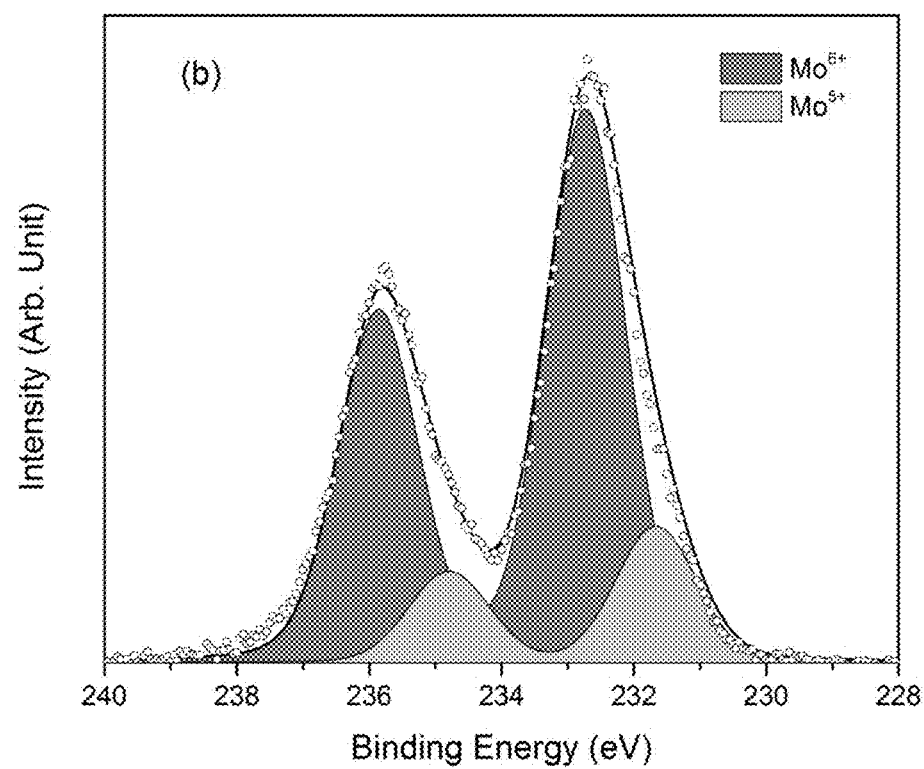
FIG. 4 shows the XPS spectra of the following structure: glass substrate/Al (150 nm)/$Al_2O_3$ (2.6 nm)/$MoO_3$ (4 nm). This figure helps identify a higher ratio of $Mo^{6+}$ compared to $Mo^{6+}$ providing evidence of Mo diffusion through pinholes of the aluminum metal anode.
Figure 6:
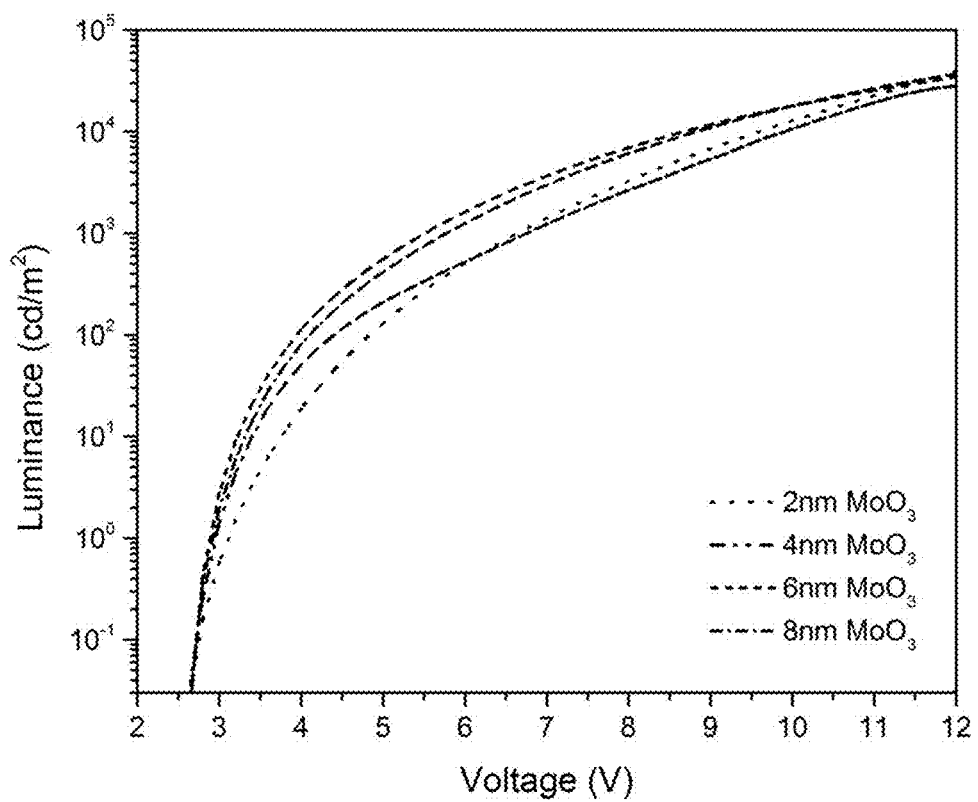

FIG. 6 shows plots of luminance versus voltage characteristics for organic light-emitting devices constructed according to FIG. 2. These were the same devices described in FIG. 3 except for the MoO$_3$ layer, which the 0 nm layer was not included in the plot. Without the transition metal oxide layer, the device was not capable of emitting any efficient light.

Figure 7:
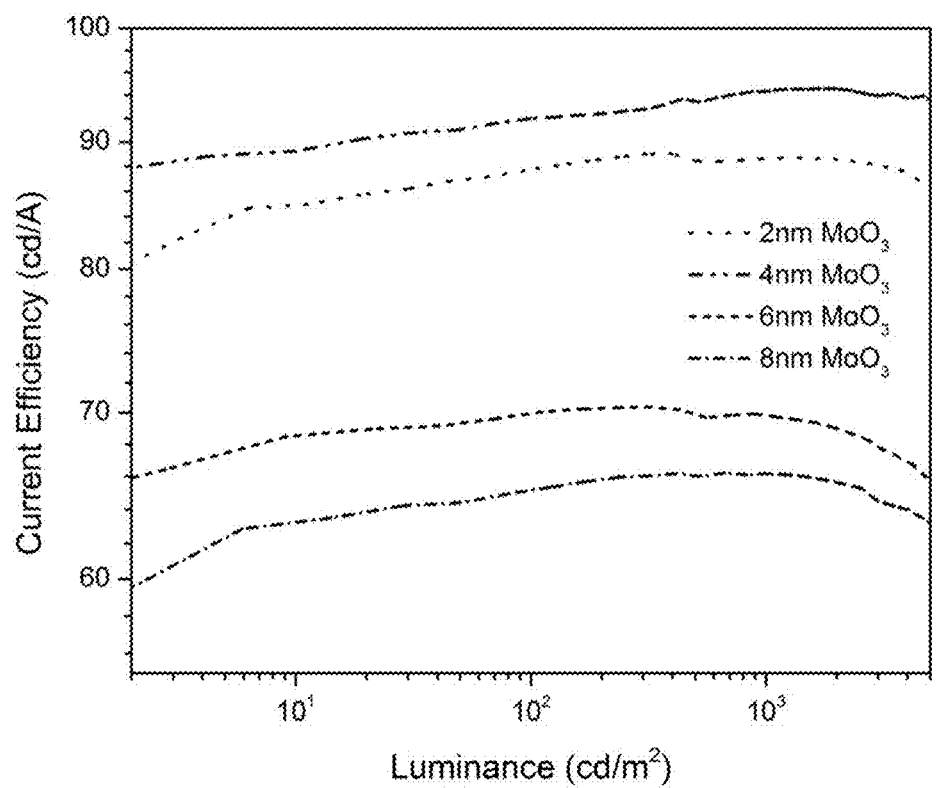

FIG. 7 shows plots of current efficiency versus luminance characteristics for organic light-emitting devices constructed according to FIG. 2. These were the same devices described in FIG. 6.

Figure 8:
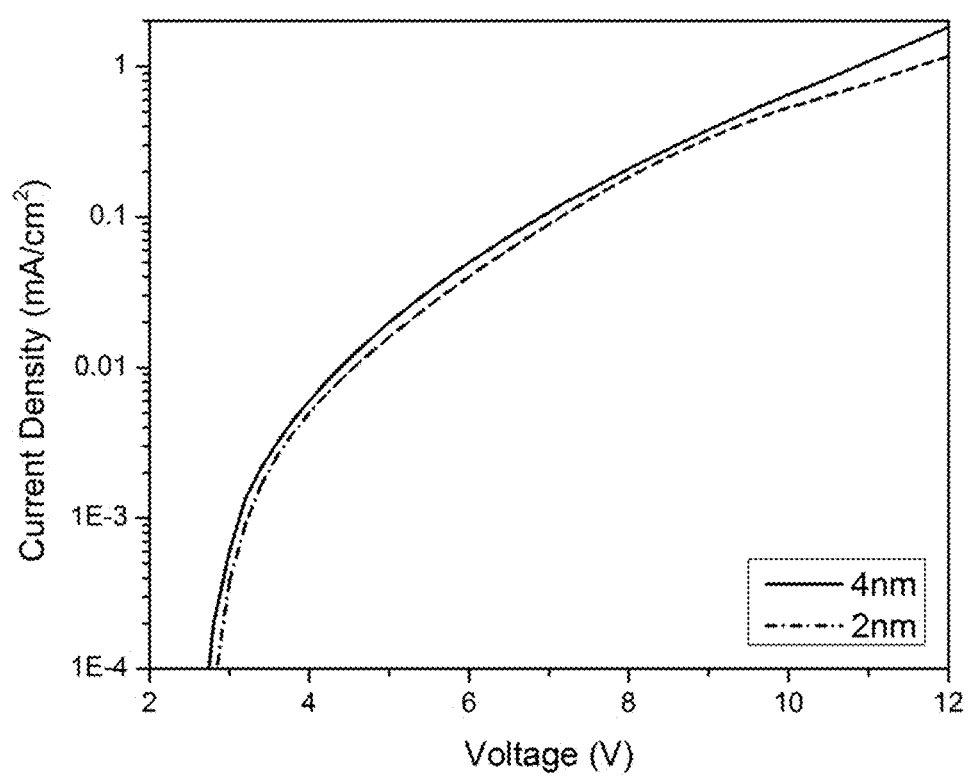

FIG. 8 shows plots of current density versus voltage characteristics for organic light-emitting devices constructed according to FIG. 2. These were the same devices described in FIG. 5 except for the MoO$_3$ in which was replaced with another transition metal oxide, ReO$_3$.

Figure 9:
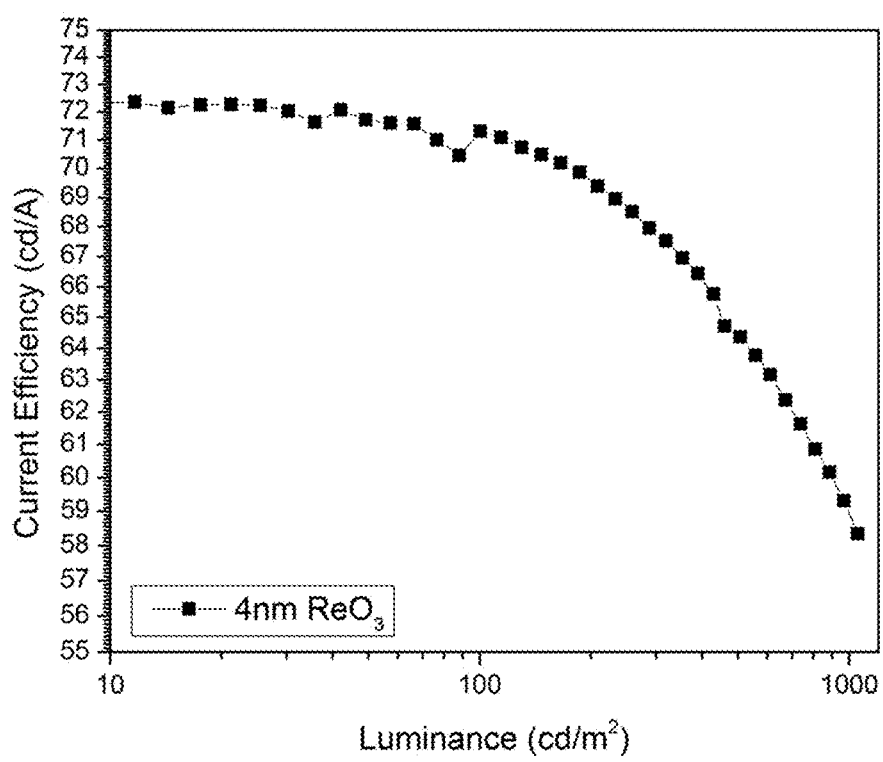

FIG. 9 shows plots of current efficiency versus luminance characteristics for organic light-emitting devices constructed according to FIG. 2. These were the same devices described in FIG. 8.

Figure 10:
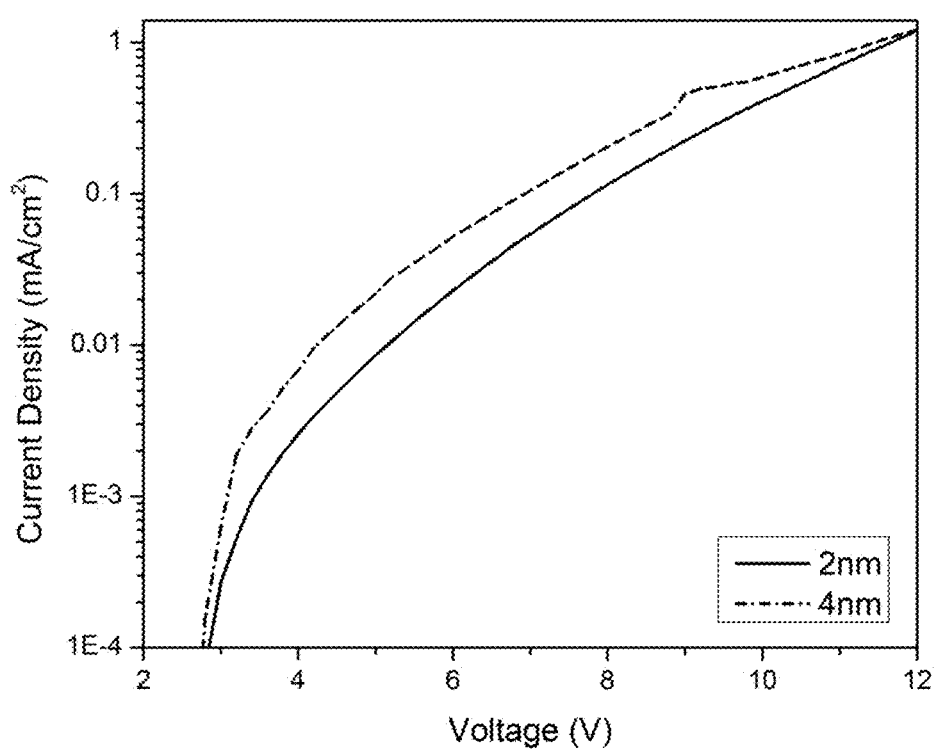

FIG. 10 shows plots of current density versus voltage characteristics for organic light-emitting devices constructed according to FIG. 2. These were the same devices described in FIG. 5 except for the MoO$_3$ in which was replaced with another transition metal oxide, WO$_3$.

Figure 11:
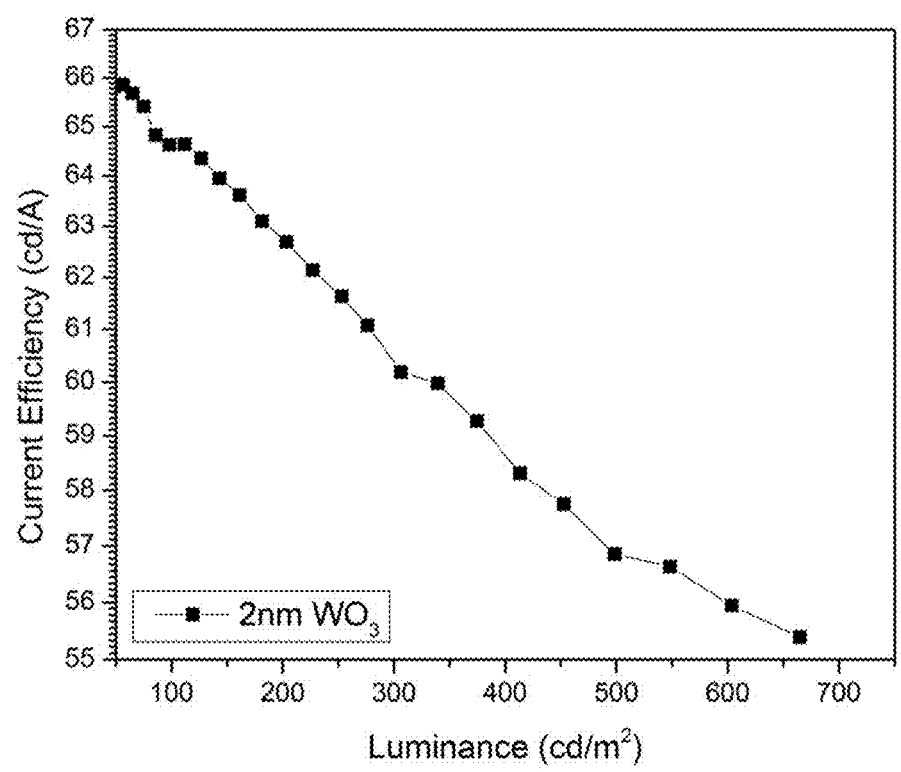

FIG. 11 shows plots of current efficiency versus luminance characteristics for organic light-emitting devices constructed according to FIG. 2. These were the same devices described in FIG. 10.

DETAILED DESCRIPTION

Various embodiments and aspects of the disclosure will be described with reference to details discussed below. The following description and drawings are illustrative of the disclosure and are not to be construed as limiting the disclosure. The figures are not to scale. Numerous specific details are described to provide a thorough understanding of various embodiments of the present disclosure. However, in certain instances, well-known or conventional details are not described in order to provide a concise discussion of embodiments of the present disclosure.

As used herein, the terms, "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

As used herein, the phrase "multiple hole injection structure", or "multilayered hole injection structure" means a layered thin-film structure comprised of a layer of insulating metal oxide adjacent to a layer of transition metal oxide having a primary function of injection of holes into a hole transport layer adjacent to the multiple hole injection structure.

As used herein, the phrase "aluminum anode" or "aluminum metal anode" means a layered structure consisting of at least one layer of aluminum or aluminum-based compounds containing at least 80% aluminum composition by weight, having the primary function of hole injection.

As used herein, the phrase "oxidized aluminum", or "native insulating aluminum oxide", or "oxide A", or "aluminum oxide" means an oxidized aluminum in which a majority of the aluminum atoms exist in their 3+ oxidation state, forming aluminum oxide (Al$_2$O$_3$). The aluminum or oxygen atoms may be bonded to additional atoms or functional groups.

As used herein, the phrase "a high work function transition metal oxide material" refers to a material with a work function higher than 5.2 eV. For example, non-limiting examples include MoO$_3$ which has a work function of 6.82 eV (+ or –0.05 eV), WO$_3$ with 6.8 eV (+ or –0.4 eV), or ReO$_3$ with 6.7 eV.

Structures formed according to the present disclosure are formed by growing a transition metal oxide on top of oxidized aluminum or aluminum-based compounds which is grown on top of pure Al or aluminum-based compounds. The oxidation of aluminum or aluminum-based compounds are not limited to ambient environment or by deposition techniques including, but not limited to, PECVD, ALD, PVD, CVD, or by ozone gas oxidation, wherein the ozone gas is produced by, but not limited to, UV irradiation of oxygen in ambient environment.

The present disclosure provides a multiple hole injection structure on oxidized aluminum or aluminum-based compounds as the anode for efficient hole injection into a molecular system or thin-film device.

Fabrication and Characterization Equipment Description

The ozone generation was carried out in a chamber equipped with a photo surface processor, model PL16-110 from Sen Lights corporation. Aluminum and aluminum-based compound films were fabricated by thermal evaporation in the metallization chamber of a SKY Technology Development Company system. The chamber base pressure was ~10$^{-8}$ Torr. The aluminum films were deposited from boron nitride crucibles in a shielded crucible heater from RD Mathis Company at a rate of 5.0 Angstrom/s. Film thickness was estimated using a calibrated quartz crystal monitor. The transition metal oxide was also thermally evaporated using the same SKY system at a rate of 1.0 Angstrom/s in similar base pressure. The specimen chemical states were investigated by X-ray photoelectron spectroscopy (XPS). The XPS measurements were carried out in a PHI 5500 ESCA system equipped with a monochromatic Al K$_\alpha$ source and a hemispherical electron analyzer.

OLED devices were fabricated on glass substrates using the SKY Technology Development Company system. Glass substrates were cleaned ultrasonically in acetone, methanol, and de-ionized water 10 minutes for each step. Subsequently, a final cleaning step consisting in a UV-ozone treatment for 15 minutes using the aforementioned photo surface processor.

Results and Discussion

Multilayered Hole Injection Layer on Oxidized Aluminum Example

Referring to FIG. 1 there is shown a layered aluminum anode with a multiple hole injection structure 10. The multiple hole injection structure 10 comprises of a substrate 11, an aluminum metal anode 12 contacting on substrate 11, an oxide A 13 on top of the aluminum metal anode 12, an oxide B 14 on top of oxide A 13, and the organic light-emitting diode layers 15.

The substrate aluminum metal anode 12 is aluminum metal and layer 13 is $Al_2O_3$. Oxide B layer 14 may, for example, be one of, but not limited to, $TiO$, $TiO_2$, $MoO_2$, $MoO_3$, $CuO$, $Cu_2O$, $NiO$, $W_{18}O_{49}$, $WO_3$, $V_2O_3$, $V_2O_5$, $Cr_2O_3$, $Cr_2O_{3-x}$, $Ta_2O_5$, $CoO$, $CO_3O_4$, $Re_2O_7$, $ReO_2$, $ReO_3$.

The substrate 11 of device 10 can be, but is not limited to, a glass substrate, an OLED, photodetector, photosensor, solar cell, tunneling diode, solid state laser. For example, substrate 11 may be a thin-film field-effect transistor. Substrate 11 can be made of any material capable of providing mechanical support to thin films. Substrate 11 could be coated with functional thin-film transistors which may be used as electrical drivers. Substrate 11 may be optically transparent to light emitted from the emissive layer. The primary function of device 10 is to provide efficient hole conductance from layer 12 into the device represented by layer 15. Case studies will be provided in current versus voltage characteristics of various OLEDs in the following text.

The high work function layer 14 defined by Oxide B is on top of Oxide A layer 13. Layer 15 is deposited on said high work function layer 14. The high work function layer 14 is greater than 5.2 eV.

Applications

Firstly, aluminum oxide anode for OLED, solar cells, organic TFTs and other electronic devices will be discussed. A typical organic light-emitting device includes an anode, an active light-emitting zone comprising one or more electroluminescent organic material(s), and a cathode. One of the electrodes is optically transmissive while the other one is optically reflective. The function of the anode electrode is to inject positive charges referred to as holes into the light-emitting zone, and that of the cathode is to inject negative charges, electrons, into the emission zone. The recombination of the electrons and the hole in the light-emitting zone leads to creation of photons, which then exit through the optically transmissive electrode as light.

Electroluminescent Device with Aluminum Oxide Anode Example

The oxidized aluminum anode structure and the light-emitting device produced according to the present disclosure will now be described, by way of example only, reference being made to the accompanying drawings, in which:

FIG. 2 shows an EL device 16, which has been constructed to demonstrate the integration of a multiple hole injection structure on an aluminum anode into a typical small organic molecule-based device of the type disclosed in U.S. Pat. No. 4,356,429. The device 16 comprises a substrate 11, a multilayered hole injection structure which includes an aluminum metal anode layer 12, oxide A layer 13, and oxide B layer 14. The device includes a hole transport layer 20 on oxide B layer 14, a light emissive layer 30 on the hole transport layer 20, an electron transport layer 40 on the light emissive layer 30, an electron injection layer 50 on the electron transport layer 40, a conductive layer 60 on the electron injection layer 50, a conductive cathode layer 70 on the conductive layer 60, and an encapsulating layer 80 on the conductive cathode layer 70. A power supply is connected across the anode layer 13 and conductive cathode layer 70 so that when the threshold voltage is applied, holes are injected from the hole emitting structure through the device 16 layer, thereby emitting light from the emissive layer 30.

The substrate 11 of device 16 can be, but is not limited to, a glass substrate, an OLED, photodetector, photosensor, solar cell, tunneling diode, solid state laser. For example, substrate 11 may be a thin-film field-effect transistor. Substrate 11 can be made of any material capable of providing mechanical support to thin films. Substrate 11 could be coated with functional thin-film transistors which may be used as electrical drivers. Substrate 11 may be optically transparent to light emitted from the emissive layer.

Oxide A layer 13 is connected to the external bias potential for hole injection when a positive bias is applied, and it may be made, for example of $Al_2O_3$. Layer 13 is on top of a conductive aluminum metal anode 12. The aluminum metal anode 12 is a layer with a preferred thickness of 100-200 nm. The oxide A layer 13 is with a preferred thickness of 2.5-4.0 nm.

Oxide B layer 14 may, for example, be one of, but not limited to, $TiO$, $TiO_2$, $MoO_2$, $MoO_3$, $CuO$, $Cu_2O$, $NiO$, $W_{18}O_{49}$, $WO_3$, $V_2O_3$, $V_2O_5$, $Cr_2O_3$, $Cr_2O_{3-x}$, $Ta_2O_5$, $CoO$, $Co_3O_4$, $Re_2O_7$, $ReO_2$, $ReO_3$. Layer 14 has a preferred thickness in a range from about 1.0 to about 10 nm.

The hole transport layer 20 is preferably an organic-based layer and maybe CBP which is commonly used as the HTL, and may have a thickness, but not limited to 45 nm. It could also be any other one or more layers of organic or polymer materials capable of transporting holes and having thickness range from 1 nm to 500 nm. The hole-transport layer 50 may be comprised of those materials disclosed in United States Patent Publication No. 20020180349 which is Ser. No. 10/117,812 published Dec. 5, 2002 which is incorporated herein by reference in its entirety, which application refers to U.S. Pat. Nos. 4,539,507; 5,151,629; 5,150,006; 5,141,671 and 5,846,666 which are all incorporated herein by reference in their entirety. This reference discloses different hole transport layer materials, electron transport layer materials, anode materials and cathode materials, which application refers to U.S. Pat. Nos. 4,539,507, 5,942,340 and 5,952,115 which are all incorporated herein by reference in their entirety.

The luminescent or light-emission layer 30 may be an organic electroluminescence layer comprised of, for example, a co-deposition of CBP (host) and Bis[2-(2-pyrindinyl-N)phenyl-C](acetylacetonato)iridium(III) or Ir(ppy)$_2$(acac) (dopant) and may have a thickness of 15 nm. It could also be a layer of an organic compound capable of emitting different colors and having a thickness in the range from about 10 nm to about 100 nm. Another example is tris-(8-hydroxyquinoline) aluminum (Alq). Other suitable materials useful for the light emission-layer include conjugated polymers such as poly (paraphenylene vinylene) (PPV); various members of PPV with and without pigment dyes such as disclosed in U.S. Pat. Nos. 5,294,869 and 5,151,629; rare earth metal, actinide or transition metal organic complex as disclosed in U.S. Pat. No. 6,524,727, all being incorporated herein by reference.

The electron transport layer 40 is preferably comprised of a 2,2',2"-(1,3,5-Benzinetriyl)-tris(1-phenyl-1-H-benzimidazole) or TPBi which a thickness ranging from 1 nm to 100 nm. The preferred thickness is around 40 nm to 70 nm. It may also be selected from other electron transport materials such as small organic molecule Alq.

The electron injection layer 50 which makes contact with the electron transport layer 40 is preferably made of 1 nm-3 nm LiF. The preferred thickness is 1 nm. However, it will be appreciated by those skilled in the art that it could be any fluoride provided it is in direct contact with the electron transport layer.

The conductive layer 60 or interfacial layer may be made using any low work function metals any alloys or mixtures such as Ca, Mg, Mg:Ag and Li:Al to mention just a few. Mg:Ag is the preferred material here with a thickness between about 1 nm to about 10 nm.

The cathode layer 70 is preferably silver (Ag) and that which has a thickness of 15 nm. Additionally, the cathode 70 may be made of one or more layers of other well-known conductive metals and/or alloys. For example, cathode 70 may be produced from one or more layers of highly conductive metals and alloys such as ITO, Al, Cr, Cu, Ag, Au, Ni, Fe, Ni, W, Mo, Co, Mg:Ag, Li:Al.

Encapsulating layer 80 may be a cathode capping layer such as N,N'-di-[(1-naphthalenyl)-N,N'-diphenyl]-1,1'-biphenyl-4,4'-diamine (NPB) made of an organic compound. Other organic compounds like CBP or inorganic compounds like dielectrics deposited by sputtering or any of the other coating techniques known to those skilled in the art may be used as the layer 80.

Electroluminescent Device Performance Characteristics Example

Figure 5:
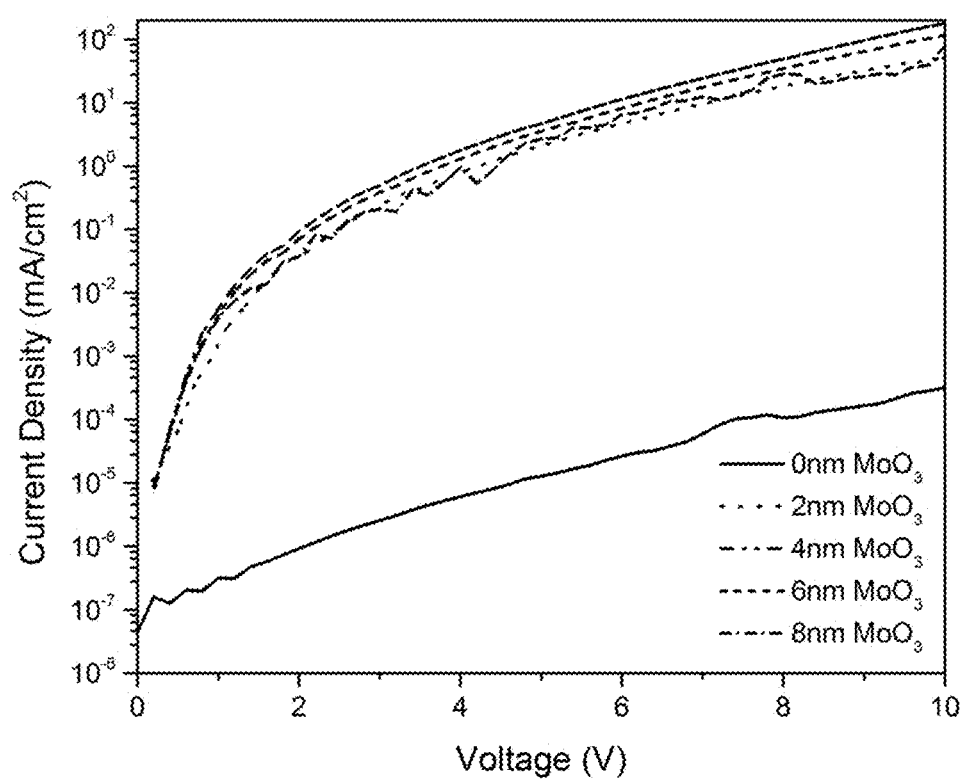
FIG. 5 shows plots of current density versus voltage characteristics for organic light-emitting devices with and without the present disclosure of the multilayered hole injection structure. The OLED device was constructed according to FIG. 2 in the following stacking sequence: substrate/metal anode/insulating metal oxide/transition metal oxide/hole transport layer/emissive layer/electron transport layer/electron injection layer/alloy electrode layer/cathode/encapsulating layer. The materials used to construct is a glass substrate, aluminum metal anode (150 nm), $Al_2O_3$ (2.6 nm) as the insulating metal oxide, $MoO_3$ (0 nm, 2 nm, 4 nm, 6 nm, 8 nm) as the transition metal oxide, 4,4'-Bis (N-carbazolyl)-1,1'-biphenyl (CBP) (45 nm) as the hole transporting layer, a co-deposition of CBP (host) and Bis[2-

FIG. 5, FIG. 6 and FIG. 7 demonstrate the effectiveness of a multiple injection anode utilizing a $MoO_3/Al_2O_3$ heterojunction in an OLED. When compared with an OLED with without the $MoO_3$, the device characteristics are significantly improved. The turn-on voltage is between 2.8 V-3.0 V; the current density is increased 5-fold; and the current efficiency is significantly improved to 94 cd/A at 1000 cd/m$^2$.

FIG. 8 and FIG. 9 demonstrate the effectiveness of a multiple injection anode utilizing a $ReO_3/Al_2O_3$ heterojunction in an OLED.

FIG. 10 and FIG. 11 demonstrate the effectiveness of a multiple injection anode utilizing a $WO_3/Al_2O_3$ heterojunction in an OLED.

Thus, in summary, an embodiment disclosed herein is a light-emitting device, comprising:
a) a substrate;
b) an aluminum metal layer on said substrate and a first oxidized aluminum layer on top of the aluminum layer;
c) a multiple layered hole injection structure comprising a layer of a high work function material on top of the first oxidized aluminum layer;
a hole transport layer on top of the high work function transition metal oxide material, wherein the transition metal oxide creates an electrically conductive contact with the underlying aluminum to allow hole transfer from the aluminum metal layer to the hole transport layer;
d) a layer of an electroluminescent material on the multiple layered hole injection structure;
f) an electrically conductive and optically transparent cathode layer on the electroluminescent material; and
g) an electrical power supply to connect the anode and cathode.

In some embodiments there is included an electron transport layer on top of said layer of an electroluminescent material sandwiched between the electroluminescent material and the an electrically conductive and optically transparent cathode layer.

In some embodiments the first oxidized aluminum layer on top of the aluminum layer is formed by exposing the aluminum layer to ambient environment.

In some embodiments the first oxidized aluminum layer on top of the aluminum layer is formed by exposing the aluminum layer to UV-ozone environment.

In some embodiments the first oxidized aluminum layer on top of the aluminum layer is formed by exposing the aluminum layer to an oxygen containing plasma.

In some embodiments the first oxidized aluminum layer on top of the aluminum layer is formed using chemical vapor deposition.

In some embodiments the first oxidized aluminum layer on top of the aluminum layer contains nitrogen.

In some embodiments the first oxidized aluminum layer on top of the aluminum layer has a thickness in a range from about 0.5 nm to about 4 nm.

In some embodiments the layer of a high work function transition metal oxide material has a work function larger than 5 eV.

In some embodiments the layer of a high work function material is a metal oxide layer.

In some embodiments the metal oxide layer is a layer of any one of $MoO_3$, $ReO_3$, and $WO_3$.

In some embodiments the layer of a high work function material is a nitrogen containing compound with a work function greater than 5.2 eV.

In some embodiments the nitrogen containing compound is any one of TiN, poly(3, 4-ethylenedioxthiophene) polystyrene sulfonate (PEDOT:PSS), and poly(9-vinylcarbazole) (PVK).

In some embodiments the aluminum is selected from the group consisting of aluminum and aluminum-based compounds.

In some embodiments the aluminum is selected from the group consisting of Al, and AgAl, TiAl, and CuAl based alloys.

The foregoing description of the embodiments of the present disclosure has been presented to illustrate the principles of the present disclosure and not to limit the present disclosure to any particular embodiments illustrated. It is intended that the scope of the present disclosure be defined by all of the embodiments encompassed within the following claims and their equivalents.

Therefore what is claimed is:

1. A light-emitting device, comprising:
a) a substrate;
b) an anode comprising an aluminum metal layer on said substrate, said aluminum metal layer having a surface oxide layer with a thickness in a range from about 0.5 to about 4 nanometers;
c) a multiple layered hole injection structure comprising a layer of a high work function reduced transition metal oxide material on top of said surface oxide layer;
a hole transport layer on top of said high work function reduced transition metal oxide material, wherein the high work function reduced transition metal oxide material creates an electrically conductive contact with the underlying aluminum metal layer to allow hole transfer from the aluminum metal layer to the hole transport layer through said surface oxide layer;
d) a layer of an electroluminescent material on said multiple layered hole injection structure;

e) an electrically conductive and optically transparent cathode layer on the said electroluminescent material; and f) an electrical power supply to connect the said anode and cathode.

2. The light-emitting device according to claim 1, further comprising an electron transport layer on top of said layer of an electroluminescent material sandwiched between said electroluminescent material and said an electrically conductive and optically transparent cathode layer.

3. The light-emitting device according to claim 2, wherein said surface oxide layer on top of said aluminum layer is formed by exposing the aluminum layer to ambient environment.

4. The light-emitting device according to claim 2, wherein said surface oxide layer on top of said aluminum layer is formed by exposing the aluminum layer to UV-ozone environment.

5. The light-emitting device according to claim 2, wherein said surface oxide layer on top of said aluminum layer is formed by exposing the aluminum layer to an oxygen containing plasma.

6. The light-emitting device according to claim 2, wherein said surface oxide layer on top of said aluminum layer is formed using chemical vapor deposition.

7. The light-emitting device according to claim 1, wherein said surface oxide layer on top of said aluminum layer is formed by exposing the aluminum layer to ambient environment.

8. The light-emitting device according to claim 1, wherein said surface oxide layer on top of said aluminum layer is formed by exposing the aluminum layer to UV-ozone environment.

9. The light-emitting device according to claim 1, wherein said surface oxide layer on top of said aluminum layer is formed by exposing the aluminum layer to an oxygen containing plasma.

10. The light-emitting device according to claim 1, wherein said surface oxide layer on top of said aluminum layer is formed using chemical vapor deposition.

11. The light-emitting device according to claim 1, wherein said surface oxide layer on top of said aluminum layer contains nitrogen.

12. The light-emitting device according to claim 1, wherein said layer of a high work function reduced transition metal oxide material has a work function larger than about 5 eV.

13. The metal oxides of claim 1, wherein said layer of a high work function reduced transition metal oxide material is a layer of any one of $MoO_3$, $ReO_3$, and $WO_3$.

14. The light-emitting device according to claim 1, wherein said layer of a high work function reduced transition metal oxide material is a nitrogen containing compound with a work function greater than 5.2 eV.

15. The light-emitting device according to claim 14, wherein said nitrogen containing compound is any one of TiN, poly(3, 4-ethylenedioxthiophene) polystyrene sulfonate (PEDOT:PSS), and poly(9-vinylcarbazole) (PVK).

16. The light-emitting device according to claim 1, wherein said aluminum is selected from the group consisting of aluminum and aluminum-based compounds.

17. The light-emitting device according to claim 1, wherein said aluminum is selected from the group consisting of Al, and AgAl, TiAl, and CuAl based alloys.

* * * * *